United States Patent
Tanaka (10) Patent No.: US 12,050,016 B2
(45) Date of Patent: Jul. 30, 2024

(54) ELECTRICAL COMPONENT BOX

(71) Applicant: DAIKIN INDUSTRIES, LTD., Osaka (JP)

(72) Inventor: Mitsuhiro Tanaka, Osaka (JP)

(73) Assignee: DAIKIN INDUSTRIES, LTD., Osaka (JP)

( * ) Notice: Subject to any disclaimer, the term of this patent is extended or adjusted under 35 U.S.C. 154(b) by 298 days.

(21) Appl. No.: 17/440,956

(22) PCT Filed: Mar. 25, 2020

(86) PCT No.: PCT/JP2020/013191
§ 371 (c)(1),
(2) Date: Sep. 20, 2021

(87) PCT Pub. No.: WO2020/196576
PCT Pub. Date: Oct. 1, 2020

(65) Prior Publication Data
US 2022/0163226 A1 May 26, 2022

(30) Foreign Application Priority Data
Mar. 28, 2019 (JP) ................................. 2019-064558

(51) Int. Cl.
*H05K 7/20* (2006.01)
*F24F 11/46* (2018.01)

(52) U.S. Cl.
CPC .......... *F24F 11/46* (2018.01); *H05K 7/20145* (2013.01); *H05K 7/20181* (2013.01); *H05K 7/20272* (2013.01)

(58) Field of Classification Search
None
See application file for complete search history.

(56) References Cited

U.S. PATENT DOCUMENTS 6,658,882 B2 * 12/2003 Ohama ................... F24F 1/027
62/262
7,757,499 B2 * 7/2010 Jensen ................... F25B 39/04
62/305
(Continued)

FOREIGN PATENT DOCUMENTS

JP 2004301477 A 10/2004
JP 2005347450 A 12/2005
(Continued)

OTHER PUBLICATIONS

International Preliminary Report on Patentability issued in corresponding International Application No. PCT/JP2020/013191, mailed on Sep. 28, 2021 (8 pages).
(Continued)

*Primary Examiner* — Courtney L Smith
(74) *Attorney, Agent, or Firm* — Osha Bergman Watanabe & Burton LLP (57) ABSTRACT

An electric component box installed in an outdoor unit of an air conditioner includes: an electronic component accommodation unit that accommodates an electronic component; an intake port through which air is drawn in from outside the electric component box; a discharge port through which air is discharged from inside the electric component box; and a cooler disposed in an airflow path extending from the intake port to the electronic component accommodation unit and that cools air.

9 Claims, 6 Drawing Sheets (56) References Cited

U.S. PATENT DOCUMENTS

| | | | |
|---|---|---|---|
| 7,974,094 B2 * | 7/2011 | Hendrix | H05K 7/20563 |
| | | | 361/679.5 |
| 10,247,428 B2 * | 4/2019 | Lu | H05K 7/20 |
| 11,585,562 B2 * | 2/2023 | Suzuki | F24F 1/0073 |
| 2006/0065970 A1 | 3/2006 | Uchida et al. | |
| 2008/0104988 A1 * | 5/2008 | Lee | F24F 13/222 |
| | | | 62/285 |
| 2009/0301123 A1 * | 12/2009 | Monk | F24F 11/0001 |
| | | | 165/56 |
| 2017/0118871 A1 * | 4/2017 | Choi | H05K 7/20354 |
| 2019/0011194 A1 * | 1/2019 | Mulinti | F24F 5/0075 |
| 2019/0242595 A1 * | 8/2019 | Eplee | F24F 13/30 |

FOREIGN PATENT DOCUMENTS

| | | | |
|---|---|---|---|
| JP | 2006100572 A | 4/2006 | |
| JP | 2007285544 A | 11/2007 | |
| JP | 2008103773 A | 5/2008 | |
| JP | 2010002120 A | 1/2010 | |
| JP | 2013011392 A | 1/2013 | |
| JP | 2014153019 A | 8/2014 | |
| JP | 2017009263 A | 1/2017 | |
| JP | 2017120170 A | 7/2017 | |
| WO | WO-03073012 A1 * | 9/2003 | F24F 1/027 |

OTHER PUBLICATIONS

International Search Report issued in corresponding International Application No. PCT/JP2020/013191 mailed Jun. 23, 2020 (3 pages).

* cited by examiner

ELECTRICAL COMPONENT BOX

TECHNICAL FIELD

The present disclosure relates to an electric component box installed in an outdoor unit of an air conditioner.

BACKGROUND

The outdoor unit of an air conditioner usually includes an electric component box accommodating electronic components that control the operation of the outdoor unit. Patent Documents 1 and 2 disclose known methods for cooling the electronic components accommodated in the electric component box. In Patent Document 1, the electric component box includes an intake port on a side wall through which air for cooling is drawn in and a discharge port on a side wall that is opposed to the intake port. In Patent Document 2, the electric component box has an enclosed space and includes an interior cooling means that cools the air of the enclosed space while allowing for natural circulation.

PATENT LITERATURE

Patent Document 1: Japanese Laid-Open Patent Publication No. 2004-301477
Patent Document 2: Japanese Laid-Open Patent Publication No. 2010-2120

The invention disclosed in Patent Document 1 uses outdoor air to cool the inside of the electric component box. Thus, the cooling performance may be insufficient when the electric component box is used in a region where the ambient temperature is high. Further, the invention disclosed in Patent Document 2 has the cooling means arranged inside the electric component box. This complicates the structure of the electric component box and enlarges the electric component box.

SUMMARY

One or more embodiments of the present disclosure provide an electric component box installed in the outdoor unit of an air conditioner that can be used in regions where the ambient temperature is high and has a simple structure.

An electric component box according to one or more embodiments is installed in an outdoor unit of an air conditioner and accommodating an electronic component. The electric component box includes an electronic component accommodation unit that accommodates the electronic component, an intake port through which air is drawn in from outside the electric component box, a discharge port through which air is discharged from inside the electric component box, and a cooler arranged in an airflow path extending from the intake port to the electronic component accommodation unit to cool air.

With this structure, air drawn in through the intake port is cooled and then supplied to the electronic component accommodation unit. This cools the electronic component even in regions where the ambient temperature is high and simplifies the structure of the electric component box.

The electric component box according to one or more embodiments further includes an intake air passage that guides air, which is drawn through the intake port, toward the electronic component accommodation unit, where the cooler is configured to cool the air in the intake air passage.

With this structure, the cooler is configured to cool the air, which is drawn in through the intake port, in the intake air passage. This simplifies the structure of the electric component box.

In the electric component box according to one or more embodiments, the intake air passage includes at least one turning portion that changes an airflow direction.

With this structure, sand, dust, rainwater, seawater, or the like is removed from the air, which is drawn in through the intake port, at the turning portion. This reduces sand, dust, rainwater, seawater, or the like deposited inside the electronic component accommodation unit.

In the electric component box according to one or more embodiments, the cooler includes a heat sink arranged in the one turning portion, the heat sink being cooled to a lower temperature than air outside the electric component box, and the heat sink includes a base that changes the airflow direction at the turning portion, a cold source unit attached to the base, and a fin unit formed on a surface of the base that is exposed to an inner side the intake air passage.

With this structure, sand, dust, rainwater, seawater, or the like is removed from the air, which is drawn in through the intake port, at the turning portion. This further reduces sand, dust, rainwater, seawater, or the like deposited inside the electronic component accommodation unit. Thus, the electric component box of the air conditioner may be used for regions full of dust where the ambient temperature is high.

In the electric component box according to one or more embodiments, the cooler includes a filter that removes dust from air.

With this structure, the filter removes dust from air. This further reduces dust deposited inside the electronic component accommodation unit. Further, the filter also removes sand, dust, rainwater, seawater, or the like from the air.

In the electric component box according to one or more embodiments, the filter includes bristles formed on a surface (cooling surface) of the cooler that cools passing air.

With this structure, the filter is formed on a place where the air strikes. This effectively removes sand, dust, rainwater, seawater, or the like. Further, sand, dust, rainwater, seawater, or the like is washed off from the surface of the cooler that cools the passing air by condensation water that forms in the cooler.

In the electric component box according to one or more embodiments, the bristles are formed on only an upstream side, with respect to an airflow, of the surface of the cooler that cools the passing air.

With this structure, condensation water that forms in the cooler easily removes sand, dust, rainwater, seawater, or the like from the air.

In the electric component box according to one or more embodiments, the cooler is configured to cool at least part of a wall forming the intake air passage.

With this structure, the cooler is further simplified.

In the electric component box according to one or more embodiments, the electric component box includes a drain port that drains condensation water, which forms when the cooler cools air.

With this structure, condensation water forming in the cooler is drained out. This restricts re-dispersion of the condensation water. Sand, dust, rainwater, seawater, or the like removed from air in the cooler is washed off and drained out with the condensation water.

DETAILED DESCRIPTION

First Embodiment

A first embodiment will now be described with reference to the drawings. It should be noted that the present disclosure is not limited to the examples described hereafter, but is intended to include any equivalents to the claims and any modification that is within the scope of the claims.

Figure 1:
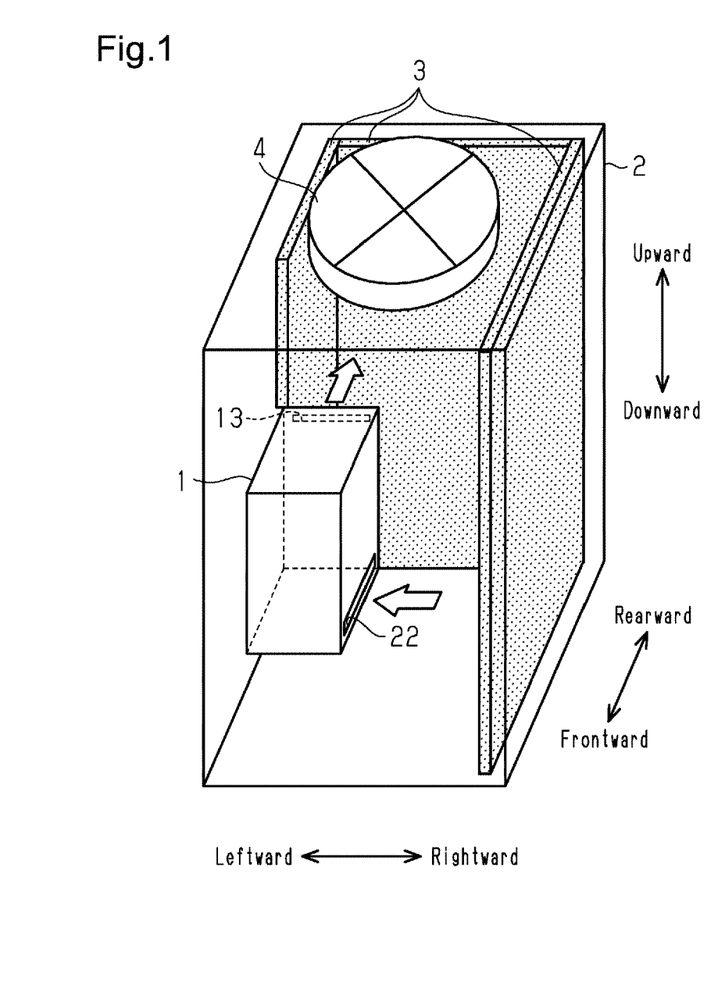
FIG. 1 is a schematic diagram showing an outdoor unit of an air conditioner according to a first embodiment.

FIG. 1 shows an outdoor unit 2 of an air conditioner. The outdoor unit 2 accommodates an electric component box 1. The outdoor unit 2 is connected to one or more indoor unit. The indoor unit will neither be illustrated nor described in the present embodiment. FIG. 1 shows the frontward, rearward, leftward, rightward, upward, and downward directions that are referred to in the present specification. In the drawings of the present application, white arrows and solid arrows indicate the airflow in the electric component box 1.

As shown in FIG. 1, the outdoor unit 2 accommodates, in addition to the electric component box 1, a compressor, an outdoor heat exchanger 3 that exchanges heat with air, and an outdoor blower 4 that generates a flow of air from the outdoor heat exchanger 3, and the like. The outdoor unit 2 is configured as an outdoor unit for a heat pump air conditioner. The compressor (not shown) is arranged in an atmosphere where the air that has passed through the outdoor heat exchanger 3 flows. The outdoor heat exchanger 3 is arranged along the inner side of an air intake in a back surface, a right surface, and the rear portion of a left surface. The outdoor heat exchanger 3 is formed by, for example, a cross fin-tube heat exchanger or a micro-channel heat exchanger including heat transfer pipes and a large number of fins. The outdoor heat exchanger 3 is connected to the compressor by a four-way valve through refrigerant pipes (not shown). The outdoor heat exchanger 3 acts as a condenser during cooling and acts as an evaporator during heating.

The outdoor blower 4 may be, for example, an axial blower (generally referred to as propeller fan). The outdoor blower 4 is arranged so that the outdoor blower 4 draws in air from the air intake in the back surface, the side surfaces, or the like and discharges the drawn air from the top surface.

Figure 2:
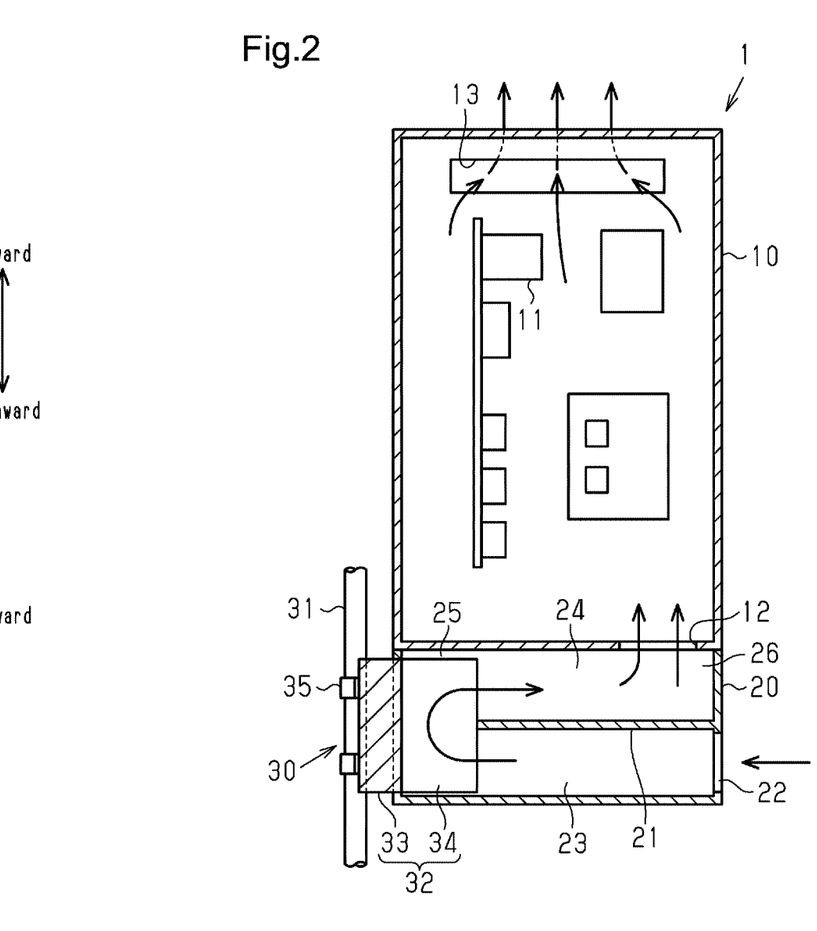
FIG. 2 is a cross-sectional view obtained by laterally cutting an electric component box installed inside the outdoor unit.

As shown in FIG. 1, the electric component box 1 is rectangular and elongated in the vertical direction as viewed from the front. The electric component box 1 is arranged in front of the outdoor heat exchanger 3 along the left surface of the outdoor unit 2. As shown in FIG. 2, the electric component box 1 includes an electronic component accommodation unit 10, an intake air passage 20, and a cooler 30.

The electronic component accommodation unit 10 accommodates electronic components 11 that control the operation of the outdoor unit 2. The electronic component accommodation unit 10 is arranged upward from the lower portion of the electric component box 1 and occupies most of the electric component box 1. The electronic component accommodation unit 10 includes a connection port 12 through which air for cooling the electronic components 11 is drawn in and a discharge port 13 through which air is discharged out of the electric component box 1. The connection port 12 extends through the bottom surface of the electronic component accommodation unit 10. The discharge port 13 is located in the upper portion of the back surface of the electronic component accommodation unit 10 so as to be close to the intake side of the outdoor blower 4. The connection port 12 and the discharge port 13 are arranged in this manner so that when the outdoor blower 4 is operated, the air for cooling the electronic components 11 is drawn into the electronic component accommodation unit 10 and then, after cooling the electronic components 11, and discharged.

As shown in FIG. 2, the intake air passage 20 is divided into two in the vertical direction by a horizontal partition 21. The intake air passage 20 includes an intake port 22, which draws in air inside the outdoor unit 2 at a lower right side of the horizontal partition 21. Air passes through the outdoor heat exchanger 3 and then flows into the outdoor unit 2. The intake air passage 20 forms an air passage that guides the air drawn from the intake port 22 to the connection port 12 of the electronic component accommodation unit 10.

The intake air passage 20 includes a lower passage portion 23 at the lower side of the horizontal partition 21 and an upper passage portion 24 at the upper side of the horizontal partition 21. The lower passage portion 23 and the upper passage portion 24 are connected at the left side of the horizontal partition 21 in a U-shaped manner. The upper passage portion 24 of the intake air passage 20 is connected at the right side to the electronic component accommodation unit 10.

The air inside the outdoor unit 2, which is drawn in through the intake port 22, flows leftward in the lower passage portion 23 and then upward when reaching the left side before it changes its airflow direction by 180 degrees to flow rightward in the upper passage portion 24. The turning portion of the airflow direction at the left side of the intake air passage 20 is referred to as a first turning portion 25. The air flowing in the upper passage portion 24 changes its airflow direction by 90 degrees when reaching the right side and is then guided through the connection port 12 into the electronic component accommodation unit 10. The turning portion of the airflow direction at the right side of the upper passage portion 24 is referred to as a second turning portion 26. Accordingly, in the present embodiment, the intake air passage 20 extending from the intake port 22 to the electronic component accommodation unit 10 has two turning portions 25, 26.

The cooler 30 uses refrigerant with low pressure and low temperature as a cold source. The cooler 30 includes a cold source unit 31 that circulates refrigerant as the cold source and a heat sink 32 that is cooled by the cold source unit 31. The heat sink 32 includes a base 33 and a fin unit 34 formed integrally with the base 33.

The cold source unit 31 circulates refrigerant as the cold source to exchange heat with the base 33 and cool the heat sink 32 to a temperature that is lower than the external temperature of the electric component box 1. The cold source unit 31 of the present embodiment is formed by a refrigerant pipe. The heat sink 32, which is made of a material having satisfactory heat conductivity such as copper, is formed by the base 33 and the fin unit 34. The heat sink 32 is inserted through an opening, which is formed in the left side of the intake air passage 20, into the turning portion 25 and fixed.

Figures 3A, 3B:
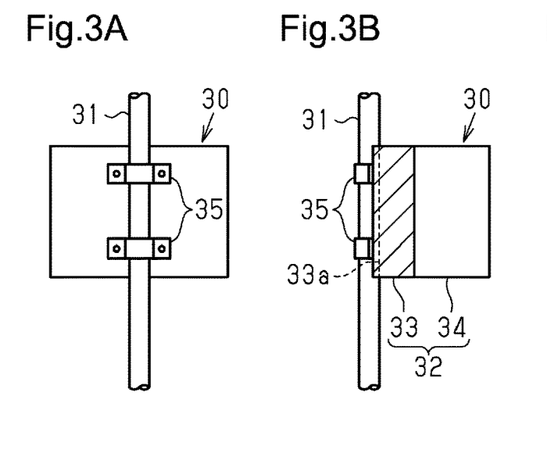
FIG. 3A is a left side view of a cooler attached to the electric component box.
FIG. 3B is a front view of the cooler attached to the electric component box.
Figure 3C:
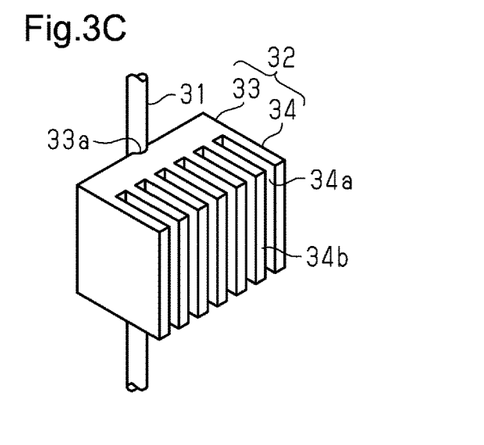
FIG. 3C is a perspective view of the cooler attached to the electric component box.

As shown in FIG. 2, the base 33 is a thick plate extending through and fixed to the left wall at the turning portion 25. Thus, the base 33 also serves as a wall that closes the opening of the left side of the intake air passage 20. As shown in FIGS. 3A to 3C, the base 33 has a left surface that includes a recess 33a in which the refrigerant pipe of the cold source unit 31 is embedded. The refrigerant pipe of the cold source unit 31 is fixed to the back side of the base 33 with clamps 35 and screws.

The fin unit 34 exchanges heat with air of which the airflow direction is changed by 180 degrees between the lower passage portion 23 and the upper passage portion 24 in the intake air passage 20. The base 33, which is a thick plate arranged at the left side, and the fin unit 34, which is arranged at the right side, are formed integrally with each other in the heat sink 32. The fin unit 34 includes grooves 34a and fins 34b. Air flowing through the lower passage portion 23 toward the turning portion 25 enters the grooves 34a and is cooled by exchanging heat with the surfaces of the fins 34b and the front surface of the base 33 (i.e. bottom surfaces of grooves 34a) as the airflow direction changes by 180 degrees.

Operation of the First Embodiment

The electric component box 1 of the first embodiment, which is formed as described above, is cooled as follows.

When the air conditioner including the outdoor unit 2 starts operation, the compressor and the outdoor blower 4 are operated. The electronic components 11, which are accommodated in the electric component box 1 and control the operation of the air conditioner, generate heat as the air conditioner operates. The electronic components 11 include a power semiconductor device that forms an inverter device as the drive circuit of the compressor. The power semiconductor device generates a large amount of heat. Air that has passed through the outdoor heat exchanger 3 flows in the periphery of the electric component box 1 as the air conditioner operates. The air contains sand, dust, rainwater, seawater, or the like. The low-temperature refrigerant flows through the refrigerant pipe of the cold source unit 31. This controls the fin unit 34 of the cooler 30 so as to be a predetermined temperature. Further, the discharge port 13 of the electric component box 1 is closer to the intake side of the outdoor blower 4 than the intake port 22, and the pressure near the discharge port 13 is lower than the pressure near the intake port 22. As a result, the air inside the electric component box 1 is discharged out of the electronic component box 1. Further, the air in the periphery of the electric component box 1 is drawn into the intake port 22 as air for cooling the electronic components 11.

The air drawn into the intake port 22 is guided through the lower passage portion 23 of the intake air passage 20 toward the first turning portion 25. The air guided to the turning portion 25 flows upward before the airflow direction changes by 180 degrees at the turning portion 25 so that centrifugal force removes sand, dust, rainwater, seawater, or the like contained from the air. The air guided to the turning portion 25 is cooled and dehumidified by the surfaces of the heat sink 32 of the cooler 30, and then flows toward the second turning portion 26. Sand, dust, rainwater, seawater, or the like remaining in the air is further removed at the turning portion 26, and the resulting air is guided through the connection port 12 into the electronic component accommodation unit 10. The air, which is drawn into the electronic component accommodation unit 10, sufficiently cools the electronic components 11 inside the electronic component accommodation unit 10 and is discharged from the discharge port 13 toward the intake side of the outdoor blower 4. The discharged air is drawn into the outdoor blower 4 and released from the outdoor unit 2.

Advantages of the First Embodiment

The electric component box 1, which is configured as described above, has the following advantages.
 (1-1) Air that has passed through the outdoor heat exchanger 3 inside the outdoor unit 2 is cooled by the cooler 30, which uses refrigerant as a cold source, before being supplied to the electronic component accommodation unit 10. This cools the electronic components 11 even in regions where the ambient temperature is high.
 (1-2) The cooler 30 is configured to cool air, which is supplied to the electronic component accommodation unit 10, in the intake air passage 20. This simplifies the structure of the cooler 30.
 (1-3) Sand, dust, rainwater, seawater, or the like is removed from the air supplied to the electronic component accommodation unit 10 at the first turning portion 25 and the second turning portion 26. This reduces sand, dust, rainwater, seawater, or the like deposited inside the electronic component accommodation unit 10. Thus, the electric component box 1 of the air conditioner may be used for regions full of dust where the ambient temperature is high. The first turning portion 25 serves to mainly remove sand, dust, rainwater, seawater, or the like, while the second turning portion 26 serves to remove sand, dust, rainwater, seawater, or the like in a supplemental manner.

Second Embodiment

The electric component box 1 according to a second embodiment will now be described with reference to FIG. 4. Like or the same reference numerals are given to those components that are like or the same as the corresponding components of the first embodiment. Such components will not be described in detail.

The electric component box 1 according to the second embodiment includes a filter 40 arranged in the fin unit 34 of the heat sink 32 of the cooler 30. The filter 40 removes sand, dust, rainwater, seawater, or the like from the air for cooling the electronic components 11. Further, the electric component box 1 drains condensation water from the heat sink 32.

Figure 4:
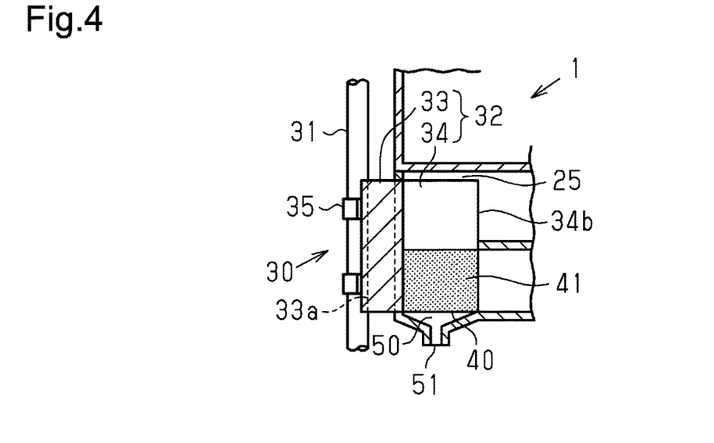
FIG. 4 is a cross-sectional view of the cooler of the electric component box according to a second embodiment and its surroundings.

As shown in FIG. 4, resin bristles 41 are attached to surfaces of the lower half of the fin unit 34 in the heat sink 32 of the cooler 30, which is arranged in the electric component box 1 according to the second embodiment, to form the filter 40. A pit 50 is formed at the lower side of the heat sink 32 in the bottom wall of the lower passage portion 23 to collect condensation water falling from the heat sink 32. The lowermost portion of the pit 50 includes a drain port 51.

The electric component box 1 according to the second embodiment has the following advantages in addition to the advantages of the electric component box 1 according to the first embodiment.

(2-1) Sand, dust, rainwater, seawater, or the like contained in the air for cooling the electronic components 11 is further removed as the air passes through the filter 40 including the bristles 41.

(2-2) Sand, dust, rainwater, seawater, or the like is washed off the filter 40 by condensation water that forms in the heat sink 32. This maintains the performance of the heat sink 32.

(2-3) Condensation water is drained out of the heat sink 32 of the cooler 30. This restricts re-dispersion of condensation water.

(2-4) Sand, dust, rainwater, seawater, or the like in air that is removed by the filter 40 of the heat sink 32 of the cooler 30 and then washed off by condensation water and drained from the drain port 51 together with the condensation water.

Third Embodiment

The electric component box 1 according to a third embodiment will now be described with reference to FIG. 5. Like or the same reference numerals are given to those components that are like or the same as the corresponding components of the second embodiment. Such components will not be described in detail.

The electric component box 1 according to the third embodiment includes the pit 50 modified from that of the electric component box 1 according to the second embodiment and a prefilter 42 that removes dust from the air drawn through the intake port 22.

Figure 5:
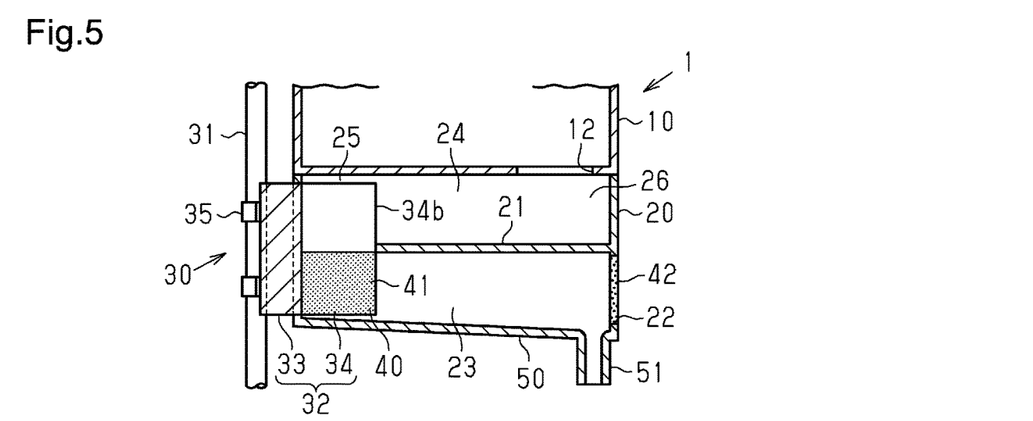
FIG. 5 is a cross-sectional view of the lower portion of the electric component box according to a third embodiment.

As shown in FIG. 5, the pit 50 arranged in the electric component box 1 according to the third embodiment includes the bottom wall of the lower passage portion 23 that is entirely sloped downward to the right side. The lowermost portion of the pit 50 at the right side includes the drain port 51. The prefilter 42 is attached in a removable manner to the intake port 22. The prefilter 42 may be one that is typically used for an indoor air intake port of an air conditioner and formed by fibers fixed to the inner side of a frame.

The electric component box 1 according to the third embodiment has the following advantages in addition to the advantages of the electric component box 1 according to the second embodiment.

(3-1) Condensation water collects at the right side of the bottom wall for drainage. This washes dust or the like from the fin unit 34 and dust or the like from the bottom wall of the lower passage portion 23.

(3-2) The prefilter 42 is arranged in the intake port 22 to remove sand, dust, rainwater, seawater, or the like from the air that is drawn into the lower passage portion 23. This further reduces sand, dust, rainwater, seawater, or the like deposited in the electronic component accommodation unit 10.

Fourth Embodiment

The electric component box 1 according to a fourth embodiment will now be described with reference to FIGS. 6A and 6B. Like or the same reference numerals are given to those components that are like or the same as the corresponding components of the first embodiment. Such components will not be described in detail.

The electric component box 1 according to the fourth embodiment includes the fin unit 34 modified from that used in the heat sink 32 of the cooler 30 according to the electric component box 1 of the first embodiment.

Figure 6A:
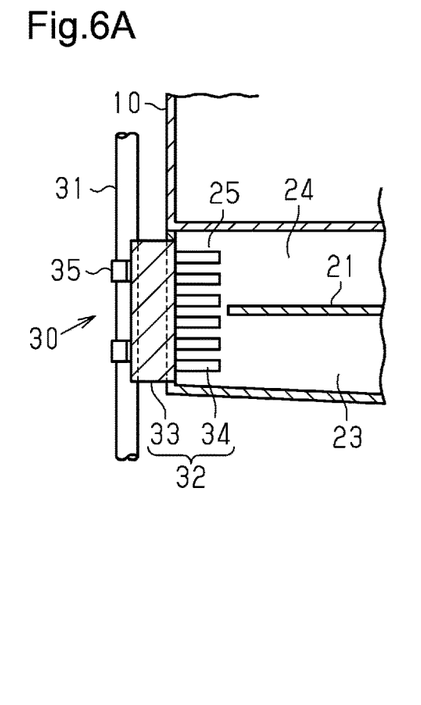
FIG. 6A is a cross-sectional view of the cooler of the electric component box according to a fourth embodiment and its surroundings.
Figure 6B:
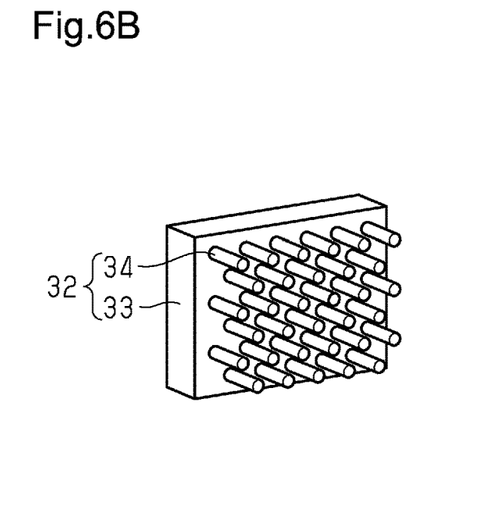
FIG. 6B is a perspective view of a heat sink of the cooler.

As shown in FIGS. 6A and 6B, the heat sink 32 of the cooler 30, which is arranged in the electric component box 1, according to the fourth embodiment includes the fins 34*b* of the first embodiment that are modified to pin fins.

The electric component box 1 according to the fourth embodiment has the following advantages in addition to the advantages of the electric component box 1 according to the second embodiment.

(4-1) The air supplied to the electronic component accommodation unit 10 strikes the pin fins and changes directions. Thus, the fin unit 34 can remove further sand, dust, rainwater, seawater, or the like contained in the air.

Fifth Embodiment

The electric component box 1 according to a fifth embodiment will now be described with reference to FIG. 7. Like or the same reference numerals are given to those components that are like or the same as the corresponding components of the second embodiment. Such components will not be described in detail.

The electric component box 1 according to the fifth embodiment includes the filter 40 modified from that of the electric component box 1 according to the second embodiment. The filter 40 is arranged in the fin unit 34 of the heat sink 32.

Figure 7:
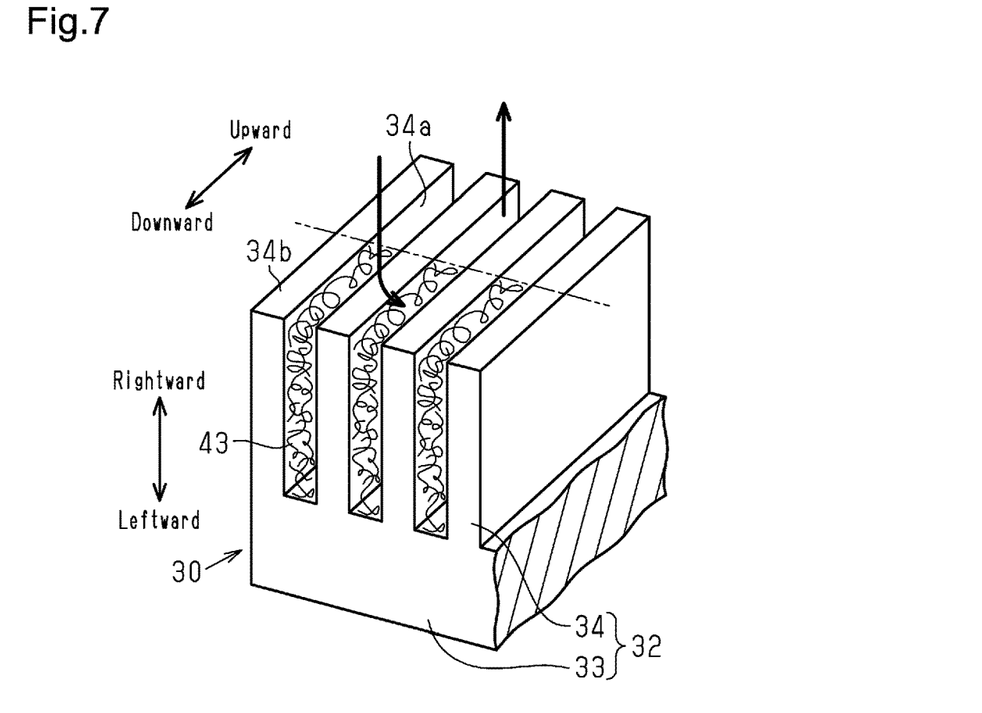
FIG. 7 is a partially enlarged perspective view of the cooler of the electric component box according to a fifth embodiment.

As shown in FIG. 7, the filter 40 according to the fifth embodiment includes metal fibers 43 in place of the bristles 41 of the filter 40 in the second embodiment. The metal fibers 43 are arranged in the grooves 34*a* between the fins 34*b*.

The electric component box 1 according to the fifth embodiment has the following advantages in addition to the advantages of the electric component box 1 according to the second embodiment.

(5-1) The filter 40 includes metal elements. In addition to removing dust, this improves the heat exchange performance of the fin unit 34.

Sixth Embodiment

The electric component box 1 according to a sixth embodiment will now be described with reference to FIG. 8. Like or the same reference numerals are given to those components that are like or the same as the corresponding components of the first embodiment. Such components will not be described in detail.

The electric component box 1 according to the sixth embodiment includes the intake air passage 20 and the cooler 30 modified from those of the first embodiment.

Figure 8:
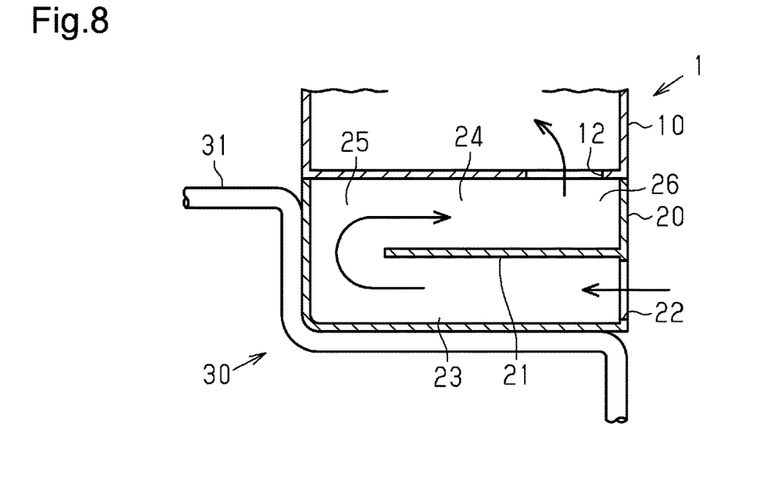
FIG. 8 is a cross-sectional view of the lower portion of the electric component box according to a sixth embodiment.

As shown in FIG. 8, the electric component box 1 according to the sixth embodiment does not include the heat sink 32 of the cooler 30 inserted into the intake air passage 20. Instead, the cooler 30 includes the cold source unit 31 that is only a refrigerant pipe guiding refrigerant serving as a cold source. The refrigerant pipe extends along the left surface and the bottom surface of the intake air passage 20. The cooler 30 in the sixth embodiment is configured to cool air, which is supplied to the electronic component accommodation unit 10, with the left surface and the bottom surface of the intake air passage 20. Thus, the cooler 30 includes the cold source unit 31 and the left surface and the bottom surface of the intake air passage 20.

The electric component box 1 according to the sixth embodiment has the following advantages in addition to the same advantages of the electric component box 1 according to the first embodiment.

(6-1) The structures of the cooler 30 and intake air passage 20 are simplified. The cold source unit 31 may have a simple structure as long as the cold source unit 31 cools at least part of the outer surface of the intake air passage 20.

Seventh Embodiment

The electric component box 1 according to a seventh embodiment will now be described with reference to FIG. 9. Like or the same reference numerals are given to those components that are like or the same as the corresponding components of the first embodiment. Such components will not be described in detail.

The electric component box 1 according to the first embodiment includes the electronic component accommodation unit 10 and the intake air passage 20 that are formed integrally with each other, whereas in the electric component box 1 according to the seventh embodiment, the electronic component accommodation unit 10 and the intake air passage 20 are separable and formed separately.

Figure 9:
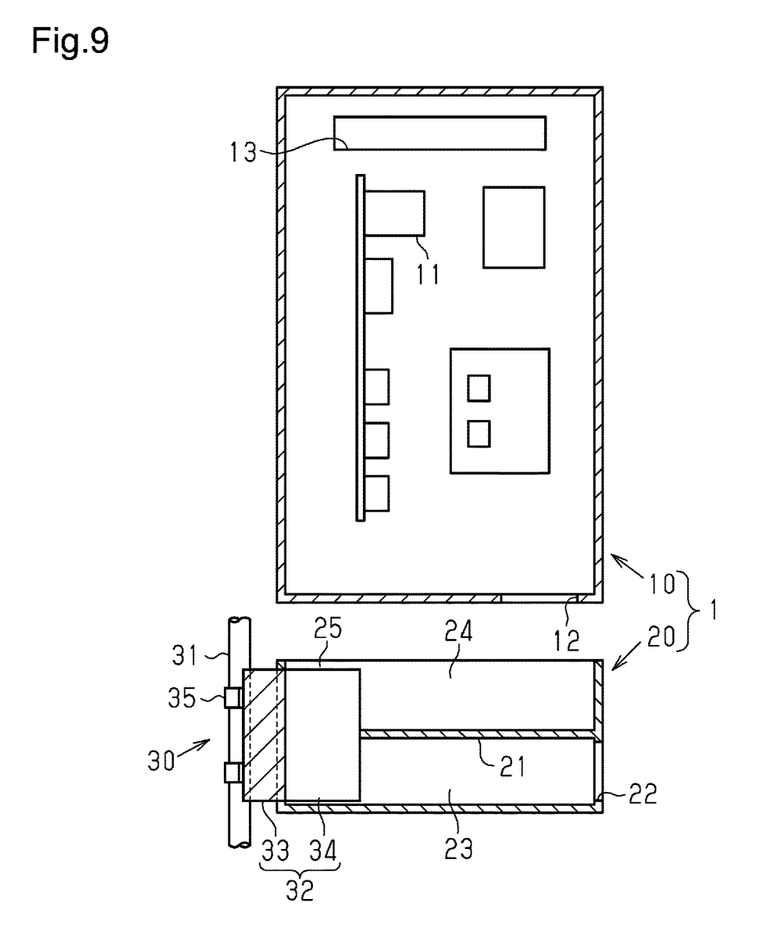
FIG. 9 is an exploded cross-sectional side view showing the electric component box according to a seventh embodiment.

As shown in FIG. 9, the electric component box 1 according to the seventh embodiment uses the bottom surface of the electronic component accommodation unit 10 as a partition wall for the intake air passage 20 and the electronic component accommodation unit 10, which accommodates the electronic components 11. Thus, the electronic component accommodation unit 10 is formed as an independent housing that has an enclosed space.

The intake air passage 20 does not have an upper wall but otherwise has the same structure as the first embodiment. The piping serving as the cold source unit 31 is shown in an attached state in FIG. 9. However, the cold source unit 31 is attached after coupling the intake air passage 20 is to the electronic component accommodation unit 10 or when coupling the intake air passage 20 to the electronic component accommodation unit 10. Thus, the intake air passage 20 may be formed without the cold source unit 31.

The heat sink 32 of the cooler 30 may be coupled to the intake air passage 20 when forming the housing of the intake air passage 20. The heat sink 32 of the cooler 30 may be coupled to the intake air passage 20 before or after coupling the housing of the intake air passage 20 to the electronic component accommodation unit 10.

The electric component box 1 according to the seventh embodiment has the following advantages in addition to the advantages of the electric component box 1 according to the first embodiment.

(7-1) The electric component box 1 includes the electronic component accommodation unit 10 and the intake air passage 20 that are separable and formed separately. Thus, the intake air passage 20 and the cooler 30 may be used as optional items for regions where the ambient temperature is high.

Eighth Embodiment

The electric component box 1 according to an eighth embodiment will now be described with reference to FIG. 10. Like or the same reference numerals are given to those components that are like or the same as the corresponding components of the first embodiment. Such components will not be described in detail.

The electric component box 1 according to the eighth embodiment is equivalent to the electric component box 1 in the first embodiment without the intake air passage 20.

Figure 10:
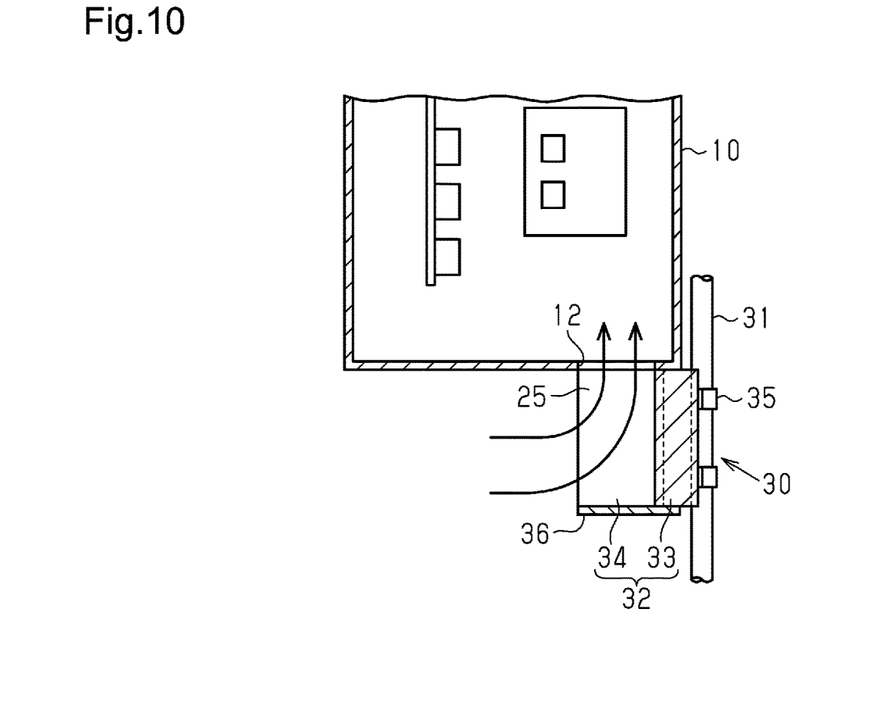
FIG. 10 is a cross-sectional view of the lower portion of the electric component box according to an eighth embodiment.

As shown in FIG. 10, in the electric component box 1 according to the eighth embodiment, the cooler 30 is coupled to the electronic component accommodation unit 10 below the connection port 12. The cooler 30 basically has the same structure as the cooler 30 of the first embodiment in which the left and right sides are symmetrical. The cold source unit 31 and the heat sink 32 have the same structures as the cold source unit 31 and the heat sink 32 of the first embodiment. In the eighth embodiment, the position and the dimensions of the opening of the connection port 12 substantially correspond to the planar position and the planar dimensions of the fin unit 34. A closure plate 36 that closes the lower surface of the grooves 34a of the fin unit 34 is attached to the lower surface of the heat sink 32. This allows air inside the outdoor unit 2 to change the airflow direction to flow from the left side of the heat sink 32 toward the connection port 12 and then into the electronic component accommodation unit 10. The angle of the airflow direction when changed in such a manner is greater than or equal to 45 degrees. The heat sink 32 serves as the first turning portion 25 that removes sand, dust, rainwater, seawater, or the like by allowing the airflow direction to change by greater than or equal to 45 degrees.

The electric component box 1 according to the eighth embodiment has the following advantages in addition to the advantages of the electric component box 1 according to the first embodiment.

(8-1) The intake air passage 20 is omitted thereby simplifying the structure of the electric component box 1.

Ninth Embodiment

The electric component box 1 according to a ninth embodiment will now be described with reference to FIG. 11. Like or the same reference numerals are given to those components that are like or the same as the corresponding components of the first embodiment. Such components will not be described in detail.

The electric component box 1 according to the ninth embodiment includes the intake air passage 20 and the cooler 30 of which the structures are changed.

Figure 11:
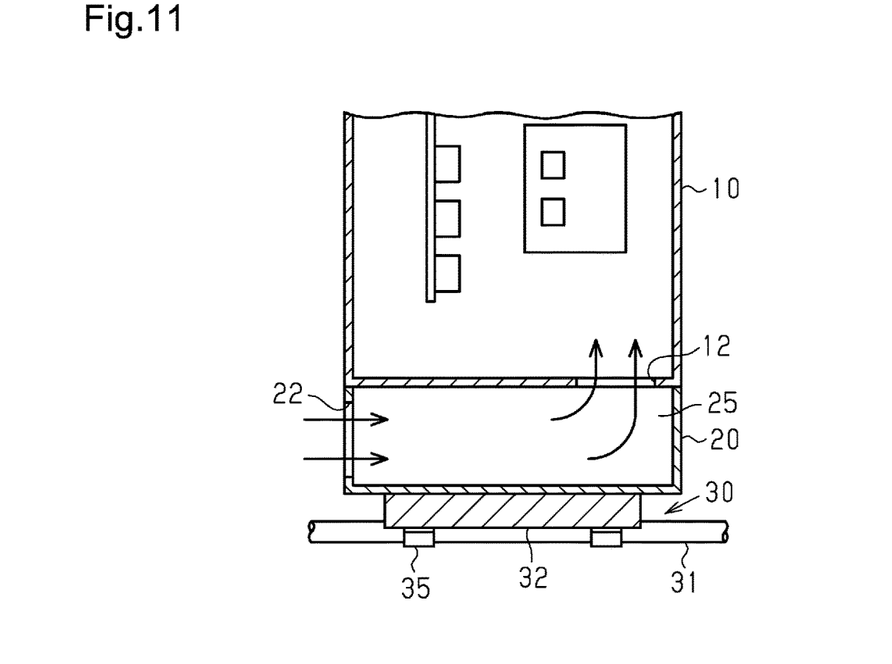
FIG. 11 is a cross-sectional view of the lower portion of the electric component box according to a ninth embodiment.

As shown in FIG. 11, the electronic component accommodation unit 10 according to the ninth embodiment is the same as the electronic component accommodation unit 10 of the first embodiment. The intake air passage 20 according to the ninth embodiment does not have the horizontal partition 21. Further, the intake port 22 is located at the left side, and the air, which is inside the intake outdoor unit 2 and is drawn in through the left intake port 22, is guided straightly to a position just before the connection port 12 at the right side. In this case, the air flowing inside the intake air passage 20 changes its airflow direction by 90 degrees when reaching the right side and is guided through the connection port 12 into the electronic component accommodation unit 10. Thus, the right side serves as the first turning portion 25 that removes sand, dust, rainwater, seawater, or the like when the airflow direction is changed by 90 degrees.

The cooler 30 of the ninth embodiment includes the cold source unit 31, which is formed by a refrigerant pipe through which low-temperature refrigerant flows, and the heat sink 32, which is formed by only a thick plate. The cold source unit 31 of the present embodiment corresponds to the cold source unit 31 of the first embodiment, and the heat sink 32 of the present embodiment corresponds to a structure that includes only the base 33 of the heat sink 32 of the first embodiment. The heat sink 32 of the present embodiment is attached in contact with the bottom surface of the intake air passage 20.

The electric component box 1 according to the ninth embodiment has the following advantages in addition to the advantages of the electric component box 1 according to the first embodiment.

(9-1) The intake air passage 20 does not need to be divided into an upper portion and a lower portion. This simplifies and downsizes the intake air passage 20. Further, the heat sink 32 includes only a plate and is thereby simplified.

Tenth Embodiment

The schematic configuration of the outdoor unit 2 according to a tenth embodiment will now be described with reference to FIG. 12. Like or the same reference numerals are given to those components that are like or the same as the corresponding components of the first embodiment. Such components will not be described in detail.

In the outdoor unit 2 according to the tenth embodiment, the structure of the electric component box 1 is changed so that ambient air is directly drawn through the intake port 22 into the electric component box 1.

Figure 12:
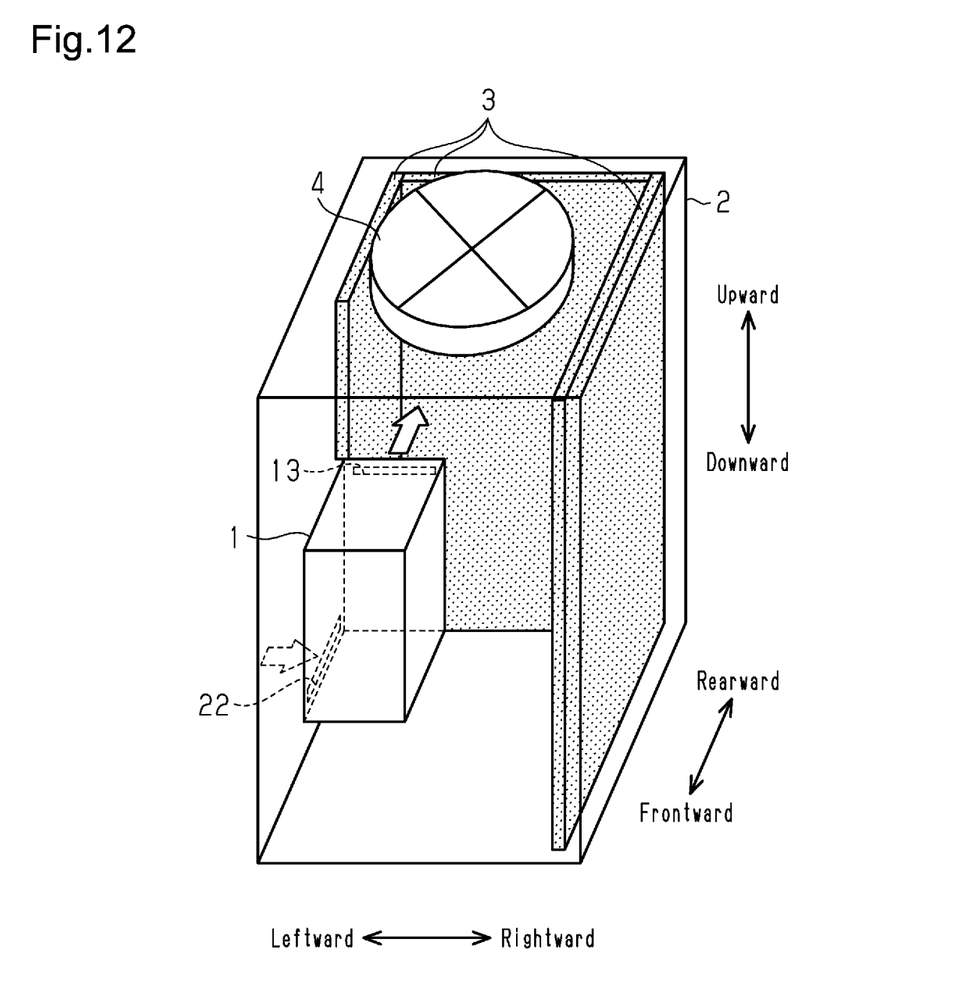
FIG. 12 is a schematic diagram showing the outdoor unit of the air conditioner according to a tenth embodiment.

As shown in FIG. 12, the electric component box 1 according to the tenth embodiment is arranged in front of the outdoor heat exchanger 3 along the left surface of the outdoor unit 2 in the same manner as the first embodiment. In the first embodiment, the intake port 22 is arranged in the right surface. In the present embodiment, however, the intake port 22 is arranged in the left surface so that ambient air is directly drawn through the intake port 22. The path (not shown) extending from the intake port 22 to the connection port 12 is symmetrically opposed to the corresponding path of the first embodiment. The left surface of the outdoor unit 2 includes an opening (not shown) exposing the intake port 22 to ambient air.

The electric component box 1 according to the tenth embodiment has the following advantages in addition to the advantages of the electric component box 1 according to the first embodiment.

(10-1) The air drawn into the electric component box 1 is ambient air prior to passage through the outdoor heat exchanger 3 and thus has a lower temperature than the air inside the outdoor unit 2. This improves the cooling effect of the electronic components 11 compared to the first embodiment.

(10-2) The difference in pressure is increased between the vicinity of the intake port 22 and the vicinity of the discharge port 13. This increases the amount of air drawn into the electronic component accommodation unit 10 and further improves the cooling effect.

Modifications

The above descriptions of the embodiments are examples of the electric component box 1 in the present disclosure and are not intended to limit versions of the electric component box 1. The electric component box 1 of the present disclosure may be configured in accordance with modifications of the embodiments as set forth below and versions in which at least two modifications are combined as long as the modifications are consistent with each other. In the following modifications, like or the same reference numerals are given to those components that are the same as the corresponding components in the above embodiments. Such components will not be described.

In each embodiment, the cold source unit 31 of the cooler 30 is formed by a refrigerant pipe. Instead, the cold source unit 31 may be a flat container through which refrigerant flows. The intake air passage 20 may have a hollow wall through which refrigerant flows. Further, a thermo-module may be employed as the cold source unit 31 in place of the refrigerant pipe through which low-temperature refrigerant flows.

The heat sink 32 of the cooler 30 may employ any structure differing from that of the first embodiment and the fourth embodiment as long as the airflow direction can be changed as designed.

The first to seventh embodiments and the tenth embodiment include two turning portions 25, 26. However, the turning portions 25, 26 may be increased in number. The turning portions, when increased in number, will ensure the removal of sand, dust, rainwater, seawater, or the like from the air and reduce the sand, dust, rainwater, seawater, or the like deposited in the electronic component accommodation unit 10.

The prefilter 42 is arranged in the third embodiment. The other embodiments may include the prefilter 42 in the same manner. Alternatively, the prefilter 42 may be omitted from the third embodiment in the same manner as the other embodiments.

The second and third embodiments include the pit 50, which receives condensation water formed in the heat sink 32, and the drain port 51. The other embodiments may also include the pit 50 and the drain port 51 in the same manner.

The electric component box 1 of the tenth embodiment is described as a modification of the electric component box 1 of the first embodiment. The electric component box 1 of any one of the second to ninth embodiments may be modified in the same manner as the tenth embodiment.

Although the disclosure has been described with respect to only a limited number of embodiments, those skilled in the art, having benefit of this disclosure, will appreciate that various other embodiments may be devised without departing from the scope of the present disclosure. Accordingly, the scope of the disclosure should be limited only by the attached claims.

The invention claimed is:

1. An electric component box installed in an outdoor unit of an air conditioner, the electric component box comprising:
    an electronic component accommodation unit that accommodates an electronic component that controls operation of the outdoor unit;
    an intake port through which air is drawn in from outside the electric component box;

a discharge port through which air is discharged from inside the electric component box; and a cooler disposed in an airflow path extending from the intake port to the electronic component accommodation unit and that cools the air that is drawn through the intake port and that cools the electronic component.

2. The electric component box according to claim 1, further comprising:

an intake air passage that guides air drawn through the intake port toward the electronic component accommodation unit, wherein the cooler cools the air in the intake air passage.

3. The electric component box according to claim 2, wherein the intake air passage comprises a turning portion that changes an airflow direction.

4. The electric component box according to claim 3, wherein the cooler comprises a heat sink in the turning portion, the heat sink is cooled to a lower temperature than air outside the electric component box, and the heat sink comprises:

a base that changes the airflow direction at the turning portion;

a cold source unit attached to the base; and a fin unit on a surface of the base, wherein the surface is exposed to an inner side of the intake air passage.

5. The electric component box according to claim 1, wherein the cooler comprises a filter that removes dust from air.

6. The electric component box according to claim 5, wherein the filter comprises bristles on a cooling surface, of the cooler, that cools passing air in the cooler.

7. The electric component box according to claim 6, wherein the bristles are disposed on only an upstream side of the cooling surface with respect to an airflow.

8. The electric component box according to claim 2, wherein the cooler cools at least part of a wall forming the intake air passage.

9. The electric component box according to claim 1, wherein the electric component box comprises a drain port that drains condensation water that forms when the cooler cools air.

* * * * *